(12) United States Patent
Mazzola et al.

(10) Patent No.: US 11,967,544 B2
(45) Date of Patent: Apr. 23, 2024

(54) METHOD OF MANUFACTURING SEMICONDUCTOR PRODUCTS, CORRESPONDING SUBSTRATE, SEMICONDUCTOR PRODUCT AND TOOL

(71) Applicant: STMicroelectronics S.r.l., Agrate Brianza (IT)

(72) Inventors: Mauro Mazzola, Calvenzano (IT); Matteo De Santa, Lombardia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 157 days.

(21) Appl. No.: 17/324,436

(22) Filed: May 19, 2021

(65) Prior Publication Data
US 2021/0375726 A1 Dec. 2, 2021

(30) Foreign Application Priority Data
May 26, 2020 (IT) .................. 102020000012379

(51) Int. Cl.
*H01L 23/495* (2006.01)
*H01L 21/50* (2006.01)
*H01L 23/00* (2006.01)

(52) U.S. Cl.
CPC .......... *H01L 23/4951* (2013.01); *H01L 21/50* (2013.01); *H01L 23/49541* (2013.01); *H01L 23/49575* (2013.01); *H01L 24/74* (2013.01)

(58) Field of Classification Search
CPC ................ H01L 23/4951; H01L 21/50; H01L 23/49541; H01L 23/49575; H01L 24/74

USPC ........................................................ 257/676
See application file for complete search history.

(56) References Cited

U.S. PATENT DOCUMENTS

| 5,054,680 A | * | 10/1991 | Stockham | ............... H01L 24/78 |
| | | | | 228/180.5 |
| 9,704,797 B2 | * | 7/2017 | Lu | .......................... H01L 24/49 |
| 2017/0221803 A1 | | 8/2017 | Kamachi et al. | |

FOREIGN PATENT DOCUMENTS

| JP | 3161128 | * | 1/2004 |
| JP | 2013026361 A | | 2/2013 |
| JP | 20130254801 A | | 12/2013 |

OTHER PUBLICATIONS

IT Search Report and Written Opinion for IT Appl. No. 102020000012379 dated Feb. 8, 2021 (10 pages).

* cited by examiner

*Primary Examiner* — Duy T Nguyen
*Assistant Examiner* — Dilinh P Nguyen
(74) *Attorney, Agent, or Firm* — Crowe & Dunlevy LLC (57) ABSTRACT

In providing electrical wire-like connections between at least one semiconductor die arranged on a semiconductor die mounting area of a substrate and an array of electrically-conductive leads in the substrate, pressure force is applied to the electrically-conductive leads in the substrate during bonding the wire-like connections to the electrically-conductive leads. Such a pressure force is applied to the electrically-conductive leads in the substrate via a pair of mutually co-operating force transmitting surfaces. These surfaces include a first convex surface engaging a second concave surface.

14 Claims, 5 Drawing Sheets

METHOD OF MANUFACTURING SEMICONDUCTOR PRODUCTS, CORRESPONDING SUBSTRATE, SEMICONDUCTOR PRODUCT AND TOOL

PRIORITY CLAIM

This application claims the priority benefit of Italian Application for Patent No. 102020000012379, filed on May 26, 2020, the content of which is hereby incorporated by reference in its entirety to the maximum extent allowable by law.

TECHNICAL FIELD

The description relates to manufacturing semiconductor products.

One or more embodiments may be applied to manufacturing integrated circuits (ICs).

BACKGROUND

Packages of semiconductor products such as integrated circuits currently comprise a substrate such as a leadframe, at least one semiconductor chip or die and an insulating molding compound resin encapsulating these elements together in a final package body.

The die or dice are placed on a die paddle (or die pad) and secured thereon using glue, solder or tape.

External contactors (currently referred to as leads or pads) are obtained from the leadframe support.

The designation "lead frame" (or "leadframe") is currently used (see, for instance the USPC Consolidated Glossary of the United States Patent and Trademark Office) to indicate a metal frame which provides support for an integrated circuit chip or die as well as electrical leads to couple the integrated circuit in the die or chip to other electrical components or contacts.

Essentially, a lead frame comprises an array of electrically-conductive formations (leads) which from an outline location extend inwardly in the direction of a die pad configured to have at least one semiconductor chip or die attached thereon.

The connection between the semiconductor die or dice and the pads or leads in the leadframe may be via wires (or ribbons).

The wire placement process, currently referred to as "wire bonding", is an important step in the assembly package flow.

Ultrasonic bonding is conventionally used to interconnect a semiconductor die to an outer lead or substrate.

Ultrasonic bonding can be performed at room temperature, using a combination of pressure and ultrasonic vibration to form a weld between two materials: this is oftentimes called "wedge-wedge bonding" to distinguish it from "ball bonding".

Such a bond involves pressing two materials together and vibrating a tool against one of the materials until this softens and connects to the other material. Aluminum, gold and copper wires are conventionally used for that purpose (with or without heat contribution).

It is noted that a good bonding of the parts involved benefits from holding these parts at a fixed position as long as possible in order to facilitate transmission of ultrasonic power through the welding interface.

While the die or dice is/are firmly held in place by the die attach material, the leads are less stable and relatively free to move.

A top clamp is conventionally applied to improve the firmness of the leads during wedge wire bonding.

The shape of the clamp can be customized following the lead shape and considering the bonding head encumbrance during assembly operation.

A finger-like shape is a conventional shape adopted for such a clamp.

In ultrasonic bonding (with no appreciable heat contribution to the welding), the clamp action plays an important role in facilitating a good bonding: with poor clamping, the leads may undesirably move during the ultrasonic energy application.

There is accordingly a need in the art to contribute in providing improved solutions addressing the issues discussed in the foregoing.

SUMMARY

One or more embodiments may relate to a method.

One or more embodiments may relate to a corresponding substrate (a leadframe, for instance) for a semiconductor product.

One or more embodiments may relate to a corresponding semiconductor product.

One or more embodiments may relate to a corresponding clamping tool.

One or more embodiments may facilitate improving the firmness of the leads in a leadframe during wire bonding such as ultrasonic wedge bonding.

One or more embodiments may facilitate holding leads in a position fixed relative to the welding interface at least as long as welding power is applied thereto.

In one or more embodiments, a top clamp may be applied during bonding to the leads/external contacts in a lead frame in order to counter undesired movement which may deteriorate the quality of a bond.

One or more embodiments may facilitate reducing scratch build-up between a clamping tool and a lead surface, reducing the risk of debris and shorts in a final IC package.

One or more embodiments may facilitate obtaining these results using relatively simple tools and manufacturing processes.

One or more embodiments may be applied to manufacturing packages of semiconductor products for power electronics applications.

One or more embodiments may facilitate providing an effective clamping force which reduces the probability of debris production on a leadframe.

One or more embodiments may facilitate providing an extended contact surface between a clamping tool and a lead for a certain volume.

One or more embodiments may facilitate providing a well-defined target area to apply a clamp tool, possibly facilitating decreasing a "forbidden area" of the leadframe as a result.

One or more embodiments may facilitate installation and maintenance of the mechanical setup used for clamping.

BRIEF DESCRIPTION OF THE DRAWINGS

One or more embodiments will now be described, by way of non-limiting example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

As exemplified herein, the drawings are in a deliberately simplified form and are not necessarily drawn to scale. Also, like parts or elements are indicated throughout the figures herein with like references/numerals: for brevity a corresponding description will not be repeated for each and every figure.

FIGS. 1A to 1E are exemplary of conventional steps in manufacturing semiconductor products. These figures exemplify manufacturing plural semiconductor products to be eventually separated ("singulated") as conventional in the art.

Figure 1A:
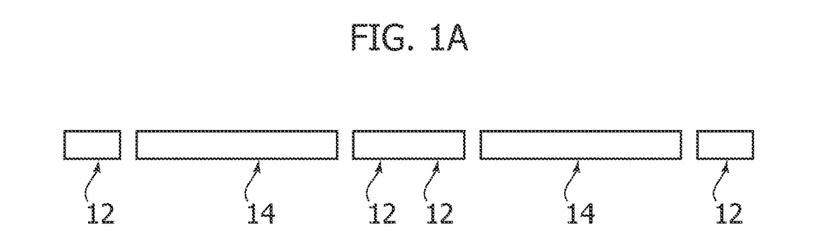
FIGS. 1A to 1E are exemplary of steps in a method of manufacturing semiconductor products.

FIG. 1A is exemplary of the provision of a substrate (leadframe) including, for each product, an array of leads 12 around a respective die pad 14.

Figure 1B:
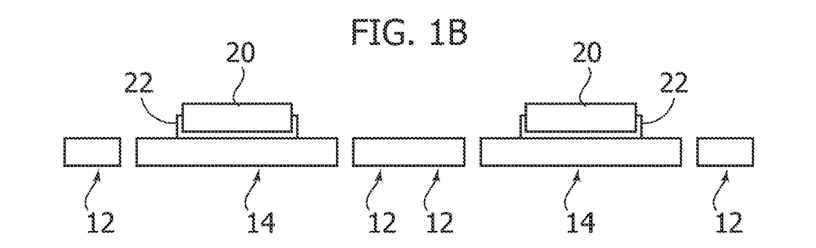

As exemplified in FIG. 1B, at least one semiconductor die 20 may be placed on each die pad 14 of the leadframe. For instance, the semiconductor die or dice 20 (a single die 20 for each die pad 14 will be considered for simplicity) may be attached on the die pads 14 via die attach material 22, e.g., soft-solder die attach material and/or glue.

Figure 1C:
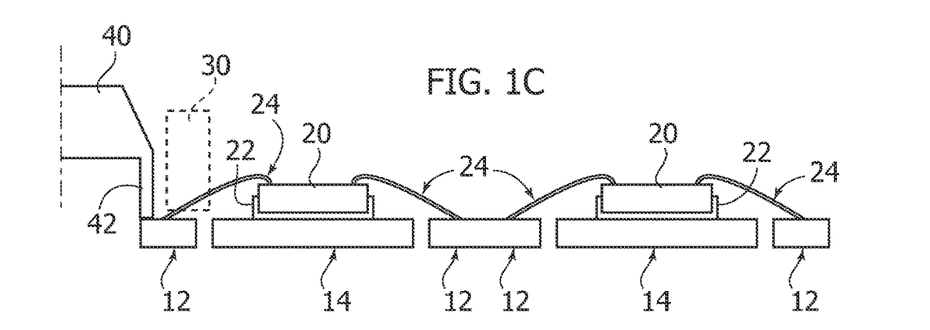

As exemplified in FIG. 1C, a wire-bonding process (e.g., "wedge-wedge" wire-bonding) can be carried out to provide electrical coupling between the semiconductor die 20 and the respective leads 22 via (wedge) wire-bonding of electrically-conductive wires 24.

To that effect, a welding tool (whose outline is shown at 30) can be used comprising a placing/delivery tool for the wires 24, in order to provide, for instance, ultrasonic energy on the electrical contact points of the leads and the semiconductor die.

A clamping tool 40 may be used having an end-tool "tip" or "finger" 42 in order to hold the lead in place during (wedge) wire-bonding.

Figure 1D:
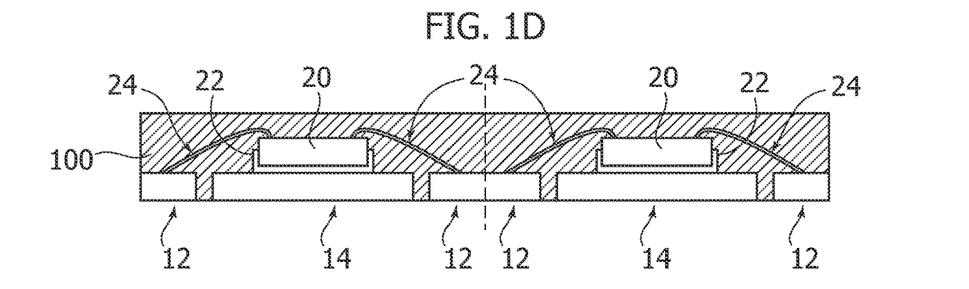

As exemplified in FIG. 1D, package molding material 100 may be molded in order to encapsulate the semiconductor dice 20 and the leadframe, possibly leaving leads 12 and pads 14 exposed at the rear side of the semiconductor products, for dissipating heat, for instance.

It is noted that such an arrangement is purely exemplary and in no way limiting. For instance, the substrate may further comprise a heat spreader or a heat slug inserted or attached to a backside of the die pad 14 opposite the semiconductor die mounting area.

Figure 1E:
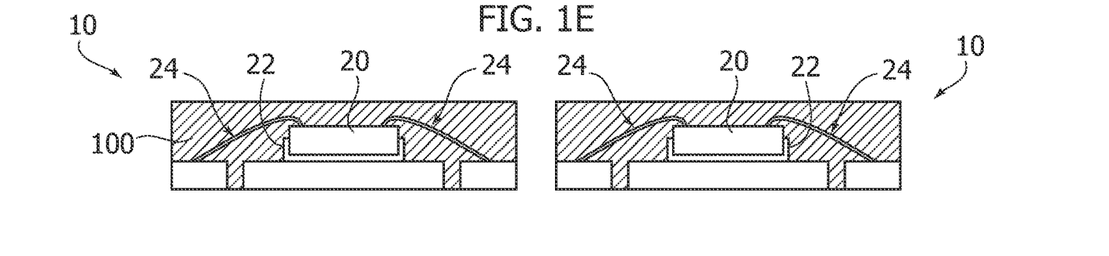

As exemplified in FIG. 1E, the individual semiconductor products 10 thus manufactured can be "singulated", e.g., by cutting or sawing along sawing lines.

Further manufacturing steps may be performed (between molding as exemplified in FIG. 1D and singulation as exemplified in FIG. 1E, for instance) which are not discussed here. Also, while advantageous, the sequence of FIGS. 1A to 1E is not mandatory.

It will be otherwise appreciated that, with the exception of the points discussed in the following, a manufacturing process as exemplified in FIGS. 1A to 1E is conventional in the art, which makes it unnecessary to provide a more detailed description herein.

Turning to FIG. 1C, the tool 30 may comprise an ultrasonic "wedge" tool, that is a tool with a wedge-shaped end having a wire-guide channel in the form of a through-passage extending obliquely to the bonding surface, which can be assumed to be horizontal for simplicity.

As discussed, after placement of a first end of a wire 24 onto a first electrical contact, any movement during the application of welding energy (ultrasonic energy, for instance) via the tool 30 may adversely affect the quality of wedge bonding.

As mentioned, while the die 20 may be firmly held in place by the die attach material to the die pad 14, the leads 12 may be less stable and relatively free to move.

In order to counter undesired movement, a clamp tool 40 comprising (thin) pressing tips or fingers 42 (in possible combination with a linear actuator D and a spacer body) may be used to retain the finger-like leads 12 during the wire-bonding operation. This may involve, for instance, pressing individual tips 42 of the end-tool against a respective one of the leads 12.

Figure 2:
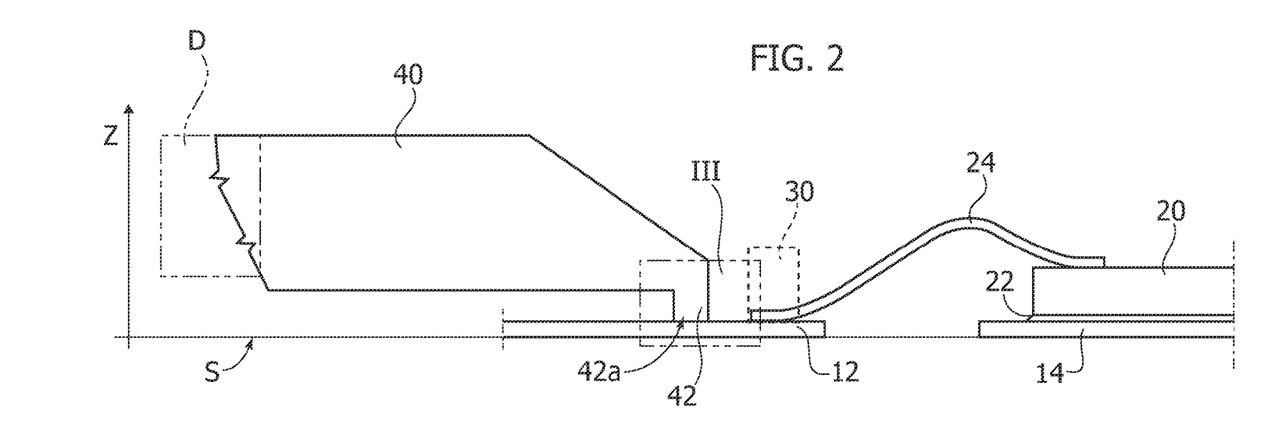
FIG. 2 is a side view of a wedge-wedge wire bond.
Figure 3:
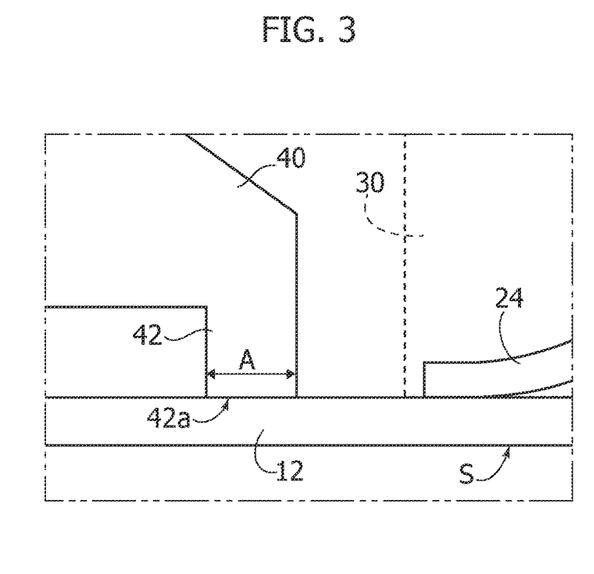
FIGS. 3 and 4 are detailed views of a portion of Figure.
Figure 4:
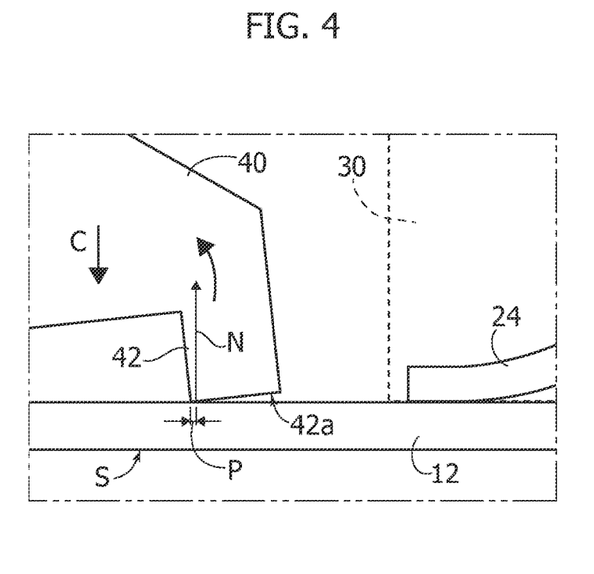

As illustrated in FIGS. 2 to 4, conventional tool tips of such clamp tools have a flat contact surface, configured to touch the lead 12 at a likewise flat contact surface.

In order to counter inasmuch as possible any movement in the leads, "double" clamp fingers can be resorted to in order to increase clamp effectiveness (and for space constraint). This approach may be disadvantageous for various reasons.

Also, the clamp tool 40 may be pressed onto the lead 12 with an increasing (ramp-like, for instance) clamping force, thus applying an increasing pressure onto the lead surface. Such a way of applying clamping pressure to the leads may involve what is currently referred to as "overtravel".

For instance, as exemplified in FIG. 2, in order to reduce the possibility of movement of the lead 12 with respect to the end of the wire 24 being held by the wedge tool 30 on the electrical contact area, a clamping force C may be applied via the end-tool tip 42 which "pins down" the lead 12 against a support surface S where the assembly process is performed.

As exemplified in FIG. 2, the clamping tool 40 may comprise an (e.g., linear) actuator D configured to be controllably movable along a first axis Z, with the axis Z being orthogonal to the support surface S, for instance, with the tool 40 having one or more (flat) distal tool tips 42 with flat terminal surfaces 42a configured to be placed onto leads 12 to be clamped in order to exert a pressure force C thereon.

As exemplified in FIG. 2, the actuator D may be located at one end of the clamping tool 40, for instance at an end opposite the end tool tip 42 (only one of these will be considered in the following for simplicity).

FIG. 3 is an enlarged view of a portion of FIG. 2 indicated by arrow III. There, a flat contact area A (force transmitting surface) of the distal tool tip surface 42a of the tip 42 of the tool 40 is shown before any "overtravel" force C is exerted onto the lead 12 of the leadframe.

As exemplified in FIG. 4, when "overtravel" force C is applied via the clamping tool 40 (perpendicularly to the surface S where the leads 12 lie), a normal reaction force N parallel and contrary to the pressure force C may be produced by the flat surface of the lead 12 (for instance thanks to the support S where it is placed during the manufacturing process). This induces a rotation of the end-tool tip surface 42a with respect to a pivot axis P.

As exemplified in FIG. 4, a protracted increased pressure on the lead surface 12 may result in the tool tip 42 tending to pivot, bend and move, slipping with respect to its desired clamping position, for instance in the direction of the lead 12.

For instance, as a result of such a rotation (exemplified in FIG. 4 with a curved arrow drawn onto the tip 42 of the tool 40) the contact area between the tool tip and the lead may vary. For instance, due to partial detachment (currently referred to as clamping gap) between the flat distal surface 42a of the tip 42 and the flat surface of the lead 12 the contact surface of the tip 42 of the tool 40 with the lead 12 may be reduced from the initial area A to a (line) edge indicated with P, with the end tip 42 of the tool 40 increasingly inclined with respect the edge P and separated from the lead 12 by the (thin) clamping gap.

Such a reduction of contact area may lead to a reduced effectiveness of the clamping tool 40 in holding the lead 12 firmly in place.

For instance, a reduced adherence of the tip 42 of the tool 40 on the surface of the lead 12 may increase a probability of (e.g., forward) movement of tip 42 of the tool 40 along the lead 12.

Also, with the contact surface reduced, possibly to an edge P, such a (forward) movement may generate undesired debris due to surface scratching of the material of the lead 12, as a result of excessive friction, for instance, such a lead material possibly being "piled up" or accumulated in front of the tool tip 42.

This may lead to an increased probability of possible further issues (such as contamination, for instance) occurring during wire bonding.

FIGS. 2 to 4 are thus exemplary of a conventional method of providing electrical wire-like connections such as wire-like connections 24 between at least one semiconductor die 20 arranged on a semiconductor die mounting area (the die pad 14, for instance) of a substrate such as a lead frame and an array of electrically-conductive formations (the leads 12) in such a substrate.

FIGS. 2 to 4 are exemplary of a pressure force C applied to the leads 12 during bonding (by the tool 30) the wire-like connections 24 to the leads 12.

As exemplified in FIGS. 2 to 4, the pressure force C is applied to the leads 12 in the leadframe via at least one pair of mutually co-operating force transmitting surfaces such as the flat distal surface 42a of the tip 42 of the clamp tool 40 and the—likewise flat—surface of the leads 12.

As discussed, applying overtravel in such an arrangement may present various drawbacks, such as: inconsistent or inhomogeneous clamping, which may cause inhomogeneous lead deformation; increased probability of resonances at the same frequency used to drive the wedge-bonding tool; increased probability of wire material buildup on wedge-bonding tool; and increased probability of shorts in the final IC package.

Figure 5:
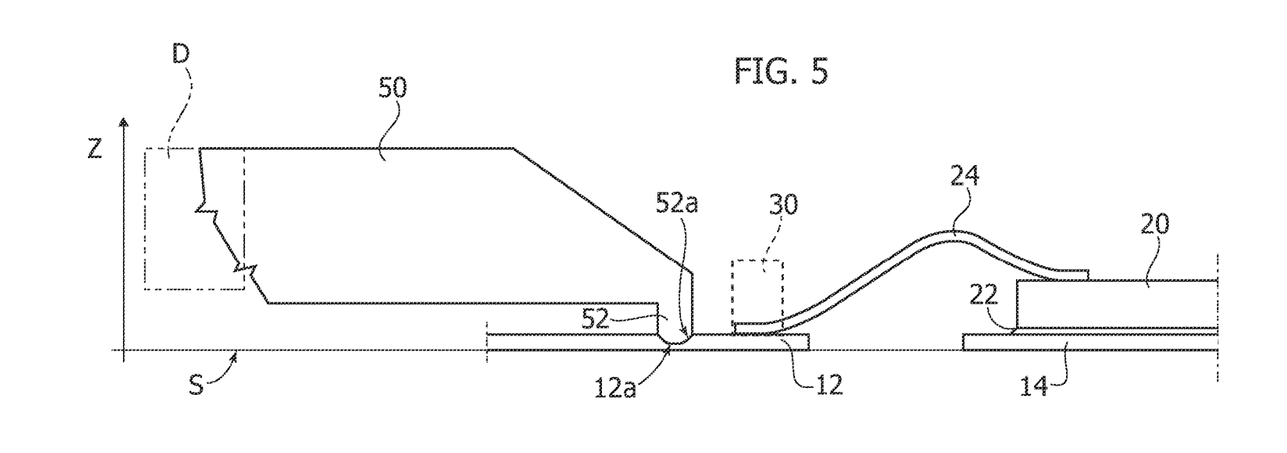
FIG. 5 is exemplary of a wire bonding step in a method according to embodiments.

FIG. 5 is a side view of an operation of clamping a lead 12 during (wedge) wire-bonding using a clamping arrangement configured to take into account the issues discussed in the foregoing.

It is observed that these issues can be effectively addressed by applying to the leads 12 in the leadframe the pressure force of the pressure tool (50 in FIG. 5) via mutually co-operating force transmitting surfaces which—contrary to the flat distal surface 42a of the tip 42 of the clamp tool 40 and the likewise flat surface of the leads 12 discussed previously—comprise a first, convex surface 52a engaging a second, concave surface 12a in the lead 12.

These convex/concave surfaces 52a, 12a can be indifferently provided on the tool 50 and on the lead 12, respectively, or vice versa.

Providing the convex surface 52a at the tip 52 of the tool 50 and the concave surface 12a in the lead(s) 12 was, however, found to be advantageous and such an option will be considered throughout the following discussion.

Such complementary concave/convex (recessed/bumped) force transmission surfaces 12a/52a can be provided by conventional techniques such as photo-etching or stamping or coining.

In one or more embodiments, such complementary concave/convex force transmission surfaces 12a/52a were found to facilitate overcoming the drawbacks discussed in the foregoing (in connection with overtravel, for instance), with the tool tip surface and the leadframe surface mutually co-operating to transmit a clamping force to the leadframe surface in an effective manner.

As exemplified in FIG. 5, the lead 12 may comprise a smoothly recessed area portion for concave surface 12a (for instance, a dimple, notch or groove). As mentioned, this recessed portion for concave surface 12a may be formed via photo-etching or stamping or coining, for instance, in a way known per se to those of skill in the art.

As exemplified in FIG. 5, a corresponding clamping arrangement may comprise a clamp tool 50 with an associated (linear) actuator D configured to be controllably movable along a first axis Z, for instance with the axis Z orthogonal to the support surface S.

Activation of the actuator D may thus facilitate placing the convex surface 52a (as discussed previously, the tool 50 may in fact be equipped with an arrays of such tips, but a single tip 52 is considered here for simplicity) onto a lead 12 to be clamped and to exert a pressure force thereon with the distal convex surface 52a shaped to engage a concave area for recessed surface 12a formed in the lead 12.

As illustrated, the surface 52a of the clamp tool 50 and the area for surface 12a of the lead 12 may exhibit matching convex/concave shapes that complement and co-operate with each other, so that a clamping force is transmitted to the leadframe surface in an effective manner.

As exemplified in FIG. 5, the shape of the formation for concave surface 12a may represent a sort of "negative" for the shape of the distal convex surface 52a (or vice versa).

In one or more embodiments, the distal convex surface 52a of the clamp tool 50 may be configured to engage the recessed portion for concave surface 12a of the lead 12 and come into contact therewith in a manner somewhat alike that of a plug configured to engage with a socket.

As exemplified in FIG. 5 (as well as in FIGS. 6 and 7): the portion for recessed surface 12a of the lead 12 may be formed to have a smooth, concave shape; and the distal convex surface 52a of the tip 52 of the clamp tool 50 may have a likewise smooth convex shape complementary to the smooth, concave shape of the recessed surface 12a.

Figure 6:
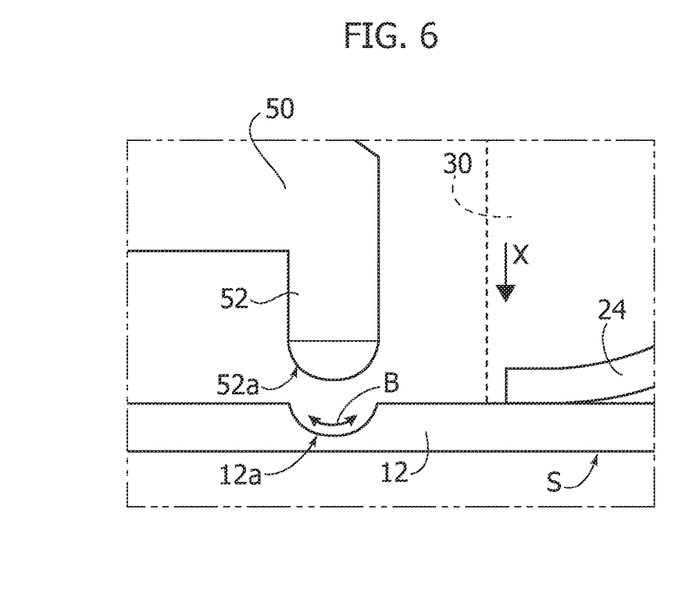
FIGS. 6 and 7 are diagrams exemplary of principles underlying embodiments.
Figure 7:
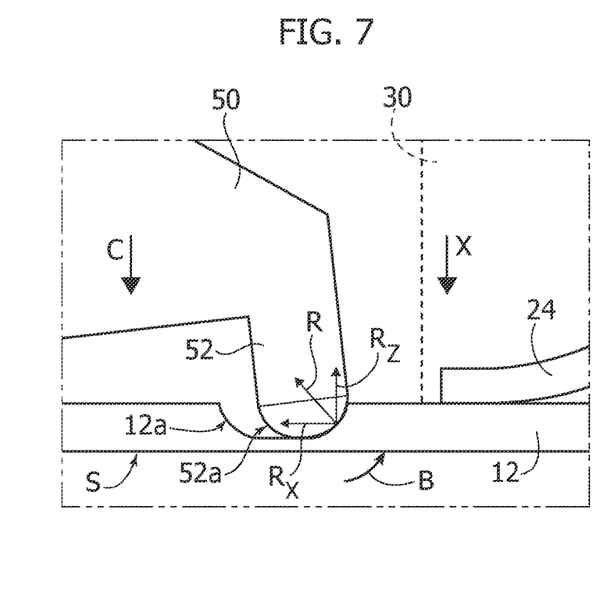

For instance, the recessed surface 12a may have a concave (hemi)spherical or (hemi)cylindrical shape, and the distal surface 52a of the tool 50 may have a corresponding convex (hemi)spherical or (hemi)cylindrical shape.

For instance, the recessed surface 12a may have a bowl-like shape. Correspondingly, the distal tool surface 52a may have a dome-like shape capable of extending into and engaging the bowl-like shape of the recessed surface 12a.

It is noted that such shapes are purely exemplary and non-limiting of embodiments: as mentioned, the surfaces 12a and 52a may have shapes selected form a wide variety of complementary concave/convex shapes.

In one or more embodiments, the surfaces 52a, 12a may comprise—at least in those portions intended to co-operate—smooth mutually co-operating surfaces, that is continuous surfaces exempt from sharp edges, so that pressure force can be transmitted between the surfaces 52a, 12a without concentrated stresses.

In one or more embodiments, while essentially matching and adapted to each other, such surfaces may have a play therebetween in terms of size (this is deliberately exaggerated in figures such as FIG. 7).

FIGS. 6 and 7 are exemplary enlarged views showing the distal surface 52a of the clamping tool 50 before and after engaging the recessed surface 12a on the lead 12 (with pressure force C subsequently applied onto the lead 12).

As exemplified in FIGS. 5 to 7, the concave recessed surface 12a of the lead 12 and the convex distal end surface 52a of the clamp tool 50 may: essentially match as a result of a first contact between the clamp tool 50 and the surface of the lead 12, before any clamping force is applied; and then at least substantially maintain the same position while clamping force is applied (also during overtravel application).

Comparing FIG. 6 with FIG. 3, one may note that thanks to the complementary (e.g., "plug and socket") convex/concave shapes of the distal end surface 52a of the tooltip 52 and of the recessed surface 12a of the lead 12, an extent B of contact surface therebetween may remain almost unvaried during the entire application of the (increasingly ramped) clamping force C.

As exemplified in FIG. 7, when pressure/clamping force C is applied, a reaction force R is opposed by the shape of the recessed surface 12a of the lead 12 to the clamp end convex surface 52a (thanks to the support provided by the support surface S, for instance).

Such a reaction force R may have: a first force component Rz opposed and parallel to the clamping force C, for instance being normal to the support surface S; and a second force component Rx perpendicular to the clamping force and (e.g., backwards) oriented to counter a possible movement (e.g., forward) of the tooltip end convex surface 52a.

As exemplified in FIG. 7, an interaction between the first force component and the clamping force C may again result in a rotational spin being imparted to the tip 52 of the clamp tool 50. Thanks to the presence of the second force component resulting from the shapes of the recessed surface 12a of the lead 12 and of the tip surface 52a, (forward) movement of the tool tip 52 with respect to the lead 12 may be effectively countered and thus limited.

As exemplified in FIG. 7, the round shape of the contact area between the end surface 52a and the surface 12a of the lead 12, results in a reduction of friction developed and in reduction of the movement of the tip 52, for instance to a range within boundaries of the recess surface 12a itself.

As mentioned, any movement of the tip convex surface 52a engaged in the recessed surface 12a due to the rotational spin may result in contact area B remaining constant or having an almost negligible variation.

A reduction of friction may extend a lifetime of the clamp tool 50, specifically of its tool tip 52.

As a further advantage of a clamping arrangement as exemplified in FIGS. 5 to 7, the reduced friction and the smoothness of the surfaces of the tip convexs surface 52a and the recess surface 12a (with no sharp edges involved) reduces the risk of debris production.

The rounded matching shapes of the tip convex surface 52a and the recessed surface 12a as exemplified herein may facilitate providing a wider contact surface between the clamp tip convex surface 52a and the surface 12a to be clamped for a certain fixed space, for instance as a result of the engaging surfaces not being flat.

Figure 8:
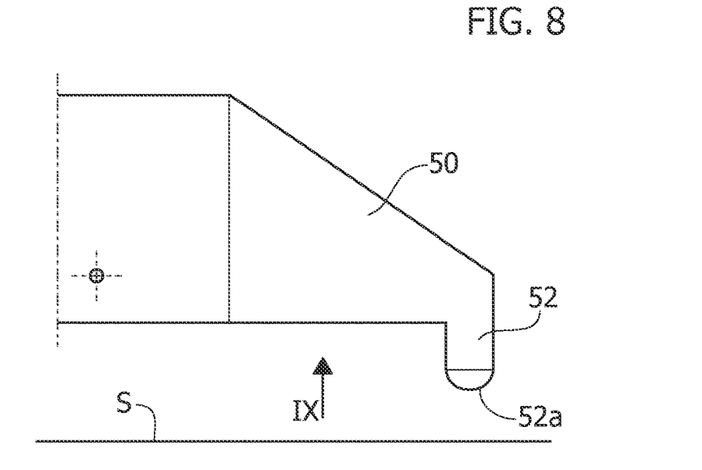
FIG. 8 is a partially broken side view of a tool for use in embodiments.
Figure 9A:
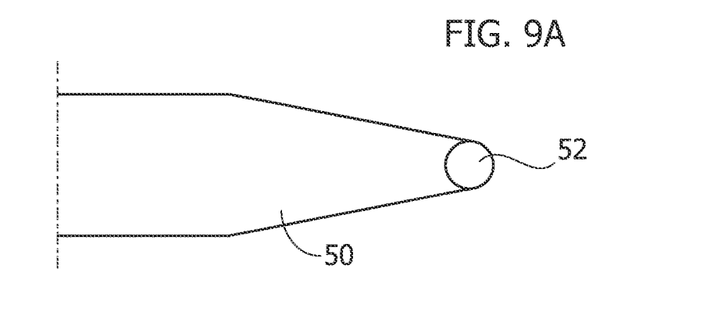
FIGS. 9A and 9B are views of FIG. 8 illustrative of possible alternative embodiments of the tool shown in FIG. 8 and FIGS. 10 to 14 are enlarged views of FIG. 6 showing alternative embodiments.
Figure 9B:
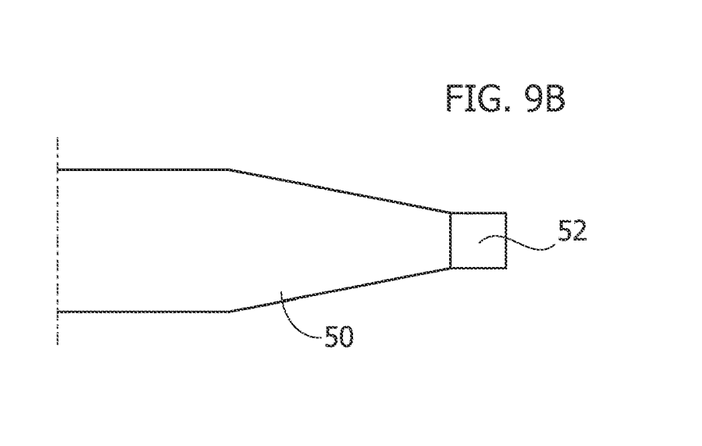

FIG. 8 is a side view of an exemplary clamping tool 50 of the clamping arrangement exemplified in FIG. 5; FIGS. 9A and 9B show bottom views along arrow IX of FIG. 8 of alternative embodiments of the clamping tool 50.

For instance:

FIG. 9A is exemplary of embodiments as discussed so far where the surface 52a of the tip 52 of the tool 50 is essentially a hemispherical convex surface, FIG. 9B is exemplary of alternative embodiments where the surface 52a of the tip 52 of the tool 50 is essentially a semi-cylindrical convex surface.

The side elevational view of FIG. 8 applies to both cases exemplified in FIGS. 9A and 9B insofar as both a hemispherical surface and a semi-cylindrical surface have a semi-circular cross section.

Figure 10:
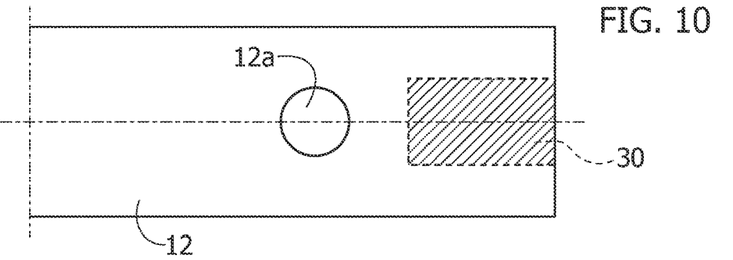
Figure 11:
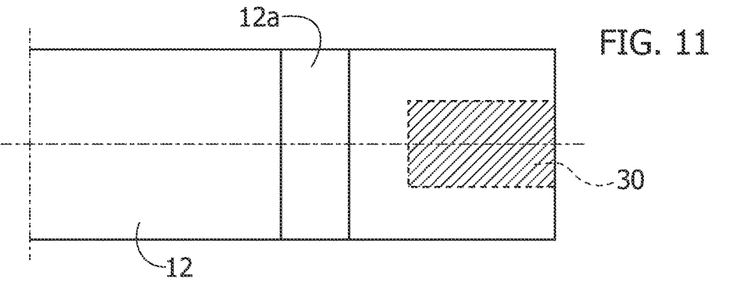

FIGS. 10 and 11 are top views along line X of FIG. 6 of a lead 12 configured to co-operate with a tool 50 as exemplified in FIGS. 9A and 9B, respectively.

In FIGS. 10 and 11 the outline of a wedge-tool 30 as used during a wire bonding process placed on the lead 12 is shown in dashes lines.

As illustrated in FIG. 10, the lead 12 may be provided with a bowl-like recessed surface 12a (briefly, a "dimple") configured to be engaged by a tip surface 52a having essentially a hemispherical convex surface (see FIG. 9A).

As illustrated in FIG. 11, the lead 12 may be provided with a channel-like semi-cylindrical groove or notch surface 12a configured to be engaged by a tip convex surface 52a having essentially a semi-cylindrical convex surface (see FIG. 9B), resulting in substantially rectangular outline extending in a transverse direction Y perpendicular a longitudinal extension of the lead 12 when viewed along arrow X of FIG. 6.

One or more embodiments may facilitate devising clamp tools 50 adapted for use in manufacturing semiconductor products (as discussed with respect to FIGS. 1A to 1E, for instance), in particular facilitating setup and calibration of the clamp tool 50. This may be related, for instance to different ways of selecting the areas of the lead frame where the clamping tool 50 is positioned to apply a clamping force.

Figure 12:
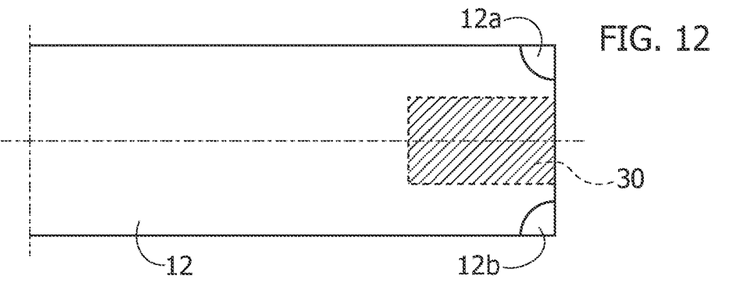
Figure 13:
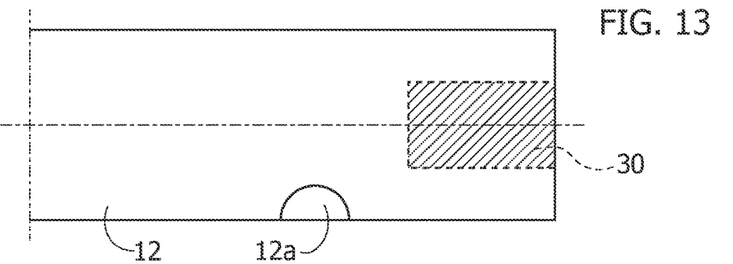
Figure 14:
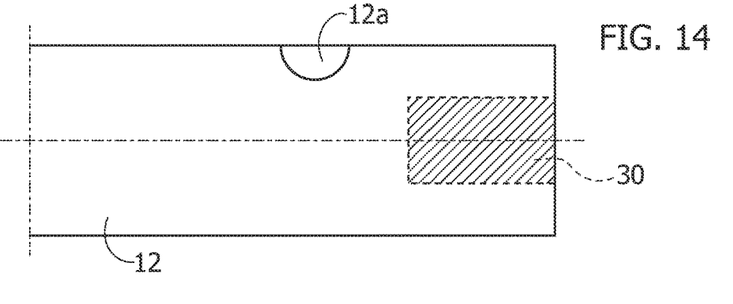

FIGS. 12 to 14 are top views along arrow X of FIG. 6 exemplary of further alternative embodiments of the recessed area in the lead 12.

As an alternative (or in possible combination) with the arrangements of FIGS. 10 and 11 (with the recessed surface 12*a* at an internal location of a respective lead 12- FIG. 10- or extending crosswise of the respective lead 12- FIG. 11), FIGS. 12 to 14 exemplify embodiments where one or more fingernail-shaped recessed surfaces 12*a* may be provided at: at least one corner portion of a respective electrically-conductive lead 12 (see FIG. 12); and a (e.g., left or right, respectively) side edge of a respective electrically-conductive lead 12 (see FIGS. 13 and 14).

Corresponding force-transmitting surfaces 52*a* of the tool tip 52 can thus be devised to engage the recessed surfaces 12*a* in the leads.

For instance, in the case of concave surfaces 12*a* located at the corners of a lead 12 as exemplified in FIG. 13, a tool 50 can be provided having a sort of split tip 52 including two convex "horns" each configured to co-operate with one of the concave surfaces 12*a*. This may, advantageously, further improve the clamping action.

A method as exemplified herein may comprise:

providing electrical wire-like connections (for instance, 24) between at least one semiconductor die (for instance, 20) arranged on a semiconductor die mounting area (for instance, 14) of a substrate (for instance, a leadframe) and an array of electrically-conductive leads (for instance, 12) in said substrate; and applying pressure force (for instance, C) to said electrically-conductive leads in said substrate during bonding (for instance, ultrasound bonding) said wire-like connections to said electrically-conductive leads.

The method may comprise applying said pressure force to said electrically-conductive leads in said substrate via at least one pair of mutually co-operating force transmitting surfaces (for instance, the surfaces 12*a*, 52*a*).

Said at least one pair of mutually co-operating force transmitting surfaces may comprise a first convex surface (for instance, 52*a*) engaging a second concave surface (for instance, 12*a*).

In a method as exemplified herein, said mutually co-operating force transmitting surfaces may be exempt from sharp edges (that is, they comprise "smooth" surfaces).

In a method as exemplified herein, said mutually co-operating force transmitting surfaces may have shapes selected from substantially hemispherical, cylindrical and fingernail-like shapes.

In a method as exemplified herein, said mutually co-operating force transmitting surfaces may comprise matching surfaces having a play in terms of size therebetween.

A method as exemplified herein may comprise increasing said pressure force during bonding said wire-like connections to said electrically-conductive leads.

A semiconductor product substrate (for instance, a leadframe) as exemplified herein may comprise a semiconductor die mounting area (for instance, 14) configured to have at least one semiconductor die (for instance, 20) mounted thereon and an array of electrically-conductive leads, said electrically-conductive leads comprising at least one force transmitting surface (for instance, 12*a*) configured to receive pressure force applied thereon during bonding to said electrically-conductive leads electrical wire-like connections to said at least one semiconductor die (20), wherein said at least one force transmitting surface may comprises at least one of a convex surface and a concave surface.

In a semiconductor product substrate as exemplified herein, said at least one force transmitting surface (for instance, 12*a*) may be exempt from sharp edges.

In a semiconductor product substrate as exemplified herein, said at least one force transmitting surface (12*a*) may have a shape selected from a substantially hemispherical, cylindrical and fingernail-like shape.

In a semiconductor product substrate as exemplified herein, said at least one force transmitting surface may comprise at least one of a convex surface and a concave surface provided: at an internal location of a respective electrically-conductive lead in said substrate (see, for instance, FIG. 10); and/or extending crosswise of a respective electrically-conductive lead in said substrate (see, for instance, FIG. 11); and/or at a corner portion of a respective electrically-conductive lead in said substrate (see, for instance, FIG. 12); and/or at a side of a respective electrically-conductive lead in said substrate (see, for instance, FIGS. 13 and 14).

In a semiconductor product substrate as exemplified herein, said at least one force transmitting surface may comprise a concave surface.

A semiconductor product as exemplified herein, may comprise: a substrate (for instance, a leadframe) as exemplified herein; at least one semiconductor die (for instance, 20) mounted a said semiconductor die mounting area in said substrate; and electrical wire-like connections (for instance, 24) from leads in said substrate to said at least one semiconductor die bonded to said electrically-conductive leads.

A pressure tool (for instance, 50) as exemplified herein, for plug-and-socket co-operation with a substrate as exemplified herein during bonding to said electrically-conductive leads in the substrate electrical wire-like connections to said at least one semiconductor die (for instance, 20), may comprise at least one distal, force transmitting surface (for instance, 52*a*) selected out of a convex surface and a concave surface configured to co-operate with a complementary concave surface or convex surface, respectively, providing said force transmitting surface in said electrically-conductive leads.

In a pressure tool as exemplified herein, said at least one force transmitting surface may be exempt from sharp edges.

In a pressure tool as exemplified herein, said at least one distal, force transmitting surface has a shape selected from a substantially hemispherical and cylindrical and fingernail-like shape.

In a pressure tool as exemplified herein, said at least one distal, force transmitting surface may comprise a convex surface.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A method, comprising:
using a welding tool for bonding electrical wire-like connections between at least one semiconductor die arranged on a semiconductor die mounting area of a substrate and an array of electrically-conductive leads of said substrate; and
using a clamping tool, separate from the welding tool, for applying a pressure force directly to said electrically-conductive leads during bonding by the welding tool of said wire-like connections to said electrically-conductive leads;
wherein applying the pressure force comprises utilizing at least one pair of mutually co- operating force transmitting surfaces, said at least one pair of mutually co-operating force transmitting surfaces comprising a first convex surface engaging a second concave surface.

2. The method of claim 1, wherein said at least one pair of mutually co- operating force transmitting surfaces are exempt from sharp edges.

3. The method of claim 1, wherein said at least one pair of mutually co-operating force transmitting surfaces are provided by hemispherical surfaces.

4. The method of claim 1, wherein said at least one pair of mutually co-operating force transmitting surfaces are provided by cylindrical surfaces.

5. The method of claim 1, wherein said at least one pair of mutually co- operating force transmitting surfaces have fingernail-like shapes.

6. The method of claim 1, wherein said at least one pair of mutually co- operating force transmitting surfaces comprise matching surfaces having a play therebetween.

7. The method of claim 1, further comprising increasing said pressure force during bonding said wire-like connections to said electrically-conductive leads.

8. The method of claim 1, wherein bonding comprises, for each of said electrically-conductive leads, using the welding tool for attaching a bonding wire to a surface of the electrically-conductive lead which is laterally offset from one of the pair of mutually co-operating force transmitting surfaces located on the electrically-conductive lead.

9. A method, comprising:
using a clamping tool for applying a pressure force directly to a first area of each electrically-conductive lead of a plurality of electrically-conductive leads that are separate from a die pad to which a semiconductor die is mounted;
while said pressure force is applied, using a welding tool that is separate from the clamping tool for performing a wirebonding between the semiconductor die and a second area of each electrically-conductive lead that is laterally offset from the first area;
wherein applying the pressure force comprises pressing a first curved surface of the clamping tool against a mutually cooperating second curved surface at the first area of each electrically-conductive lead.

10. The method of claim 9, wherein the first curved surface and mutually cooperating second curved surface comprise a convex surface and a concave surface, respectively.

11. The method of claim 9, wherein the first curved surface and mutually cooperating second curved surface comprise a concave surface and a convex surface, respectively.

12. The method of claim 9, wherein the first curved surface and mutually cooperating second curved surface are provided by hemispherical surfaces.

13. The method of claim 9, wherein the first curved surface and mutually cooperating second curved surface are provided by cylindrical surfaces.

14. The method of claim 9, wherein the first curved surface is convex and the mutually cooperating second curved surface is concave, and wherein a size of an end of the clamping tool defined by the first curved surface is smaller than a size of a concavity in the electrically-conductive lead at the first area defined by the mutually cooperating second curved surface.

* * * * *